(12) United States Patent
Kim et al.

(10) Patent No.: US 10,784,442 B2
(45) Date of Patent: Sep. 22, 2020

(54) METHOD OF MANUFACTURING A MAGNETORESISTIVE RANDOM ACCESS MEMORY DEVICE

(71) Applicant: SAMSUNG ELECTRONICS CO., LTD., Suwon-si, Gyeonggi-do (KR)

(72) Inventors: Whan-Kyun Kim, Seoul (KR); Deok-Hyeon Kang, Suwon-si (KR); Woo-Jin Kim, Hwaseong-si (KR); Woo-Chang Lim, Seongnam-si (KR); Jun-Ho Jeong, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 92 days.

(21) Appl. No.: 16/114,638

(22) Filed: Aug. 28, 2018

(65) Prior Publication Data
US 2019/0165262 A1    May 30, 2019

(30) Foreign Application Priority Data

Nov. 24, 2017  (KR) .................. 10-2017-0158859

(51) Int. Cl.
| | |
|---|---|
| *H01L 43/12* | (2006.01) |
| *G11C 11/16* | (2006.01) |
| *H01F 41/32* | (2006.01) |
| *H01L 27/22* | (2006.01) |
| *H01F 10/32* | (2006.01) |
| *H01L 43/02* | (2006.01) |
| *H01F 41/30* | (2006.01) |

(52) U.S. Cl.
CPC .......... *H01L 43/12* (2013.01); *G11C 11/161* (2013.01); *H01F 10/3254* (2013.01); *H01F 41/307* (2013.01); *H01F 41/32* (2013.01); *H01L 27/228* (2013.01); *H01L 43/02* (2013.01)

(58) Field of Classification Search
None
See application file for complete search history.

(56) References Cited

U.S. PATENT DOCUMENTS

| | | |
|---|---|---|
| 8,278,123 B2 | 10/2012 | Choi et al. |
| 9,276,198 B2 | 3/2016 | Lim et al. |

(Continued)

OTHER PUBLICATIONS

Tsunoda, et al. "60% magnetoresistance at room temperature in Co—Fe/Al—O/Co—Fe tunnel junctions oxidized with Kr—$O_2$ plasma;" Appl. Phys. Lett., vol. 80, No. 17, Apr. 29, 2002.

(Continued)

*Primary Examiner* — Yu-Hsi D Sun
(74) *Attorney, Agent, or Firm* — Lee IP Law, P.C.

(57) ABSTRACT

A method of manufacturing an MRAM device, the method including forming a first magnetic layer on a substrate; forming a first tunnel barrier layer on the first magnetic layer such that the first tunnel barrier layer includes a first metal oxide, the first metal oxide being formed by oxidizing a first metal layer at a first temperature; forming a second tunnel barrier layer on the first tunnel barrier layer such that the second tunnel barrier layer includes a second metal oxide, the second metal oxide being formed by oxidizing a second metal layer at a second temperature that is greater than the first temperature; and forming a second magnetic layer on the second tunnel barrier layer.

18 Claims, 19 Drawing Sheets

(56) References Cited

U.S. PATENT DOCUMENTS

| | | | |
|---|---|---|---|
| 9,444,037 B2 | 9/2016 | Whig et al. | |
| 2009/0268351 A1* | 10/2009 | Zeltser | B82Y 10/00 360/324.2 |
| 2012/0288963 A1* | 11/2012 | Nishimura | B82Y 10/00 438/3 |
| 2013/0056349 A1 | 3/2013 | Kitagawa et al. | |
| 2017/0084829 A1 | 3/2017 | Lee et al. | |
| 2017/0110651 A1 | 4/2017 | Park et al. | |
| 2018/0040810 A1 | 2/2018 | Lee et al. | |

OTHER PUBLICATIONS

Parkin, et al. "Giant tunnelling magnetoresistance at room temperature with MgO (100) tunnel barriers;" Nature Materials, vol. 3, pp. 862-867, Dec. 2004. Published online: Oct. 31, 2004.

* cited by examiner

METHOD OF MANUFACTURING A MAGNETORESISTIVE RANDOM ACCESS MEMORY DEVICE

CROSS-REFERENCE TO RELATED APPLICATION

Korean Patent Application No. 10-2017-0158859, filed on Nov. 24, 2017, in the Korean Intellectual Property Office, and entitled: "Method of Manufacturing a Magnetoresistive Random Access Memory Device," is incorporated by reference herein in its entirety.

BACKGROUND

1. Field

Embodiments relate to a method of manufacturing a magnetoresistive random access memory (MRAM) device.

2. Description of the Related Art

An MRAM device may include a magnetic tunnel junction (MTJ) structure in which a tunnel barrier layer is interposed between magnetic layers, and data may be stored in the MRAM device by using the resistance difference of the MTJ structure according to the spins of the magnetic layers.

SUMMARY

The embodiments may be realized by providing a method of manufacturing an MRAM device, the method including forming a first magnetic layer on a substrate; forming a first tunnel barrier layer on the first magnetic layer such that the first tunnel barrier layer includes a first metal oxide, the first metal oxide being formed by oxidizing a first metal layer at a first temperature; forming a second tunnel barrier layer on the first tunnel barrier layer such that the second tunnel barrier layer includes a second metal oxide, the second metal oxide being formed by oxidizing a second metal layer at a second temperature that is greater than the first temperature; and forming a second magnetic layer on the second tunnel barrier layer.

The embodiments may be realized by providing a method of manufacturing an MRAM device, the method including forming a first magnetic layer on a substrate; forming a first metal layer on the first magnetic layer by performing a DC sputtering process; forming a first tunnel barrier layer that includes a first metal oxide by oxidizing the first metal layer at a first temperature with a mixed gas that includes an inert gas and oxygen gas; forming a second metal layer on the first tunnel barrier layer by performing a DC sputtering process; forming a second tunnel barrier layer that includes a second metal oxide by oxidizing the second metal layer with the mixed gas at a second temperature, that is greater than the first temperature; and forming a second magnetic layer on the second tunnel barrier layer.

The embodiments may be realized by providing a method of manufacturing an MRAM device, the method including forming a first magnetic layer on a substrate; forming a first tunnel barrier layer on the first magnetic layer such that the first tunnel barrier layer includes a first metal oxide, the first metal oxide being formed by oxidizing a first metal layer; forming a second tunnel barrier layer on the first tunnel barrier layer such that the second tunnel barrier layer includes a second metal oxide, the second metal oxide being formed by oxidizing a second metal layer that includes a same metal as that of the first metal layer, such that the second tunnel barrier layer has a metal content that is less than a metal content of the first tunnel barrier layer; and forming a second magnetic layer on the second tunnel barrier layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
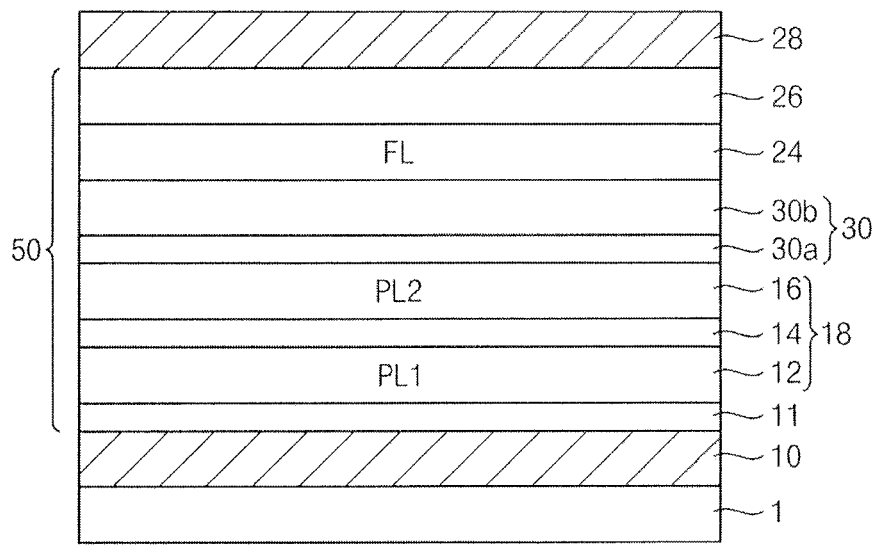
FIG. 1 illustrates a cross-sectional view of an MRAM device in accordance with example embodiments.
Figure 2:
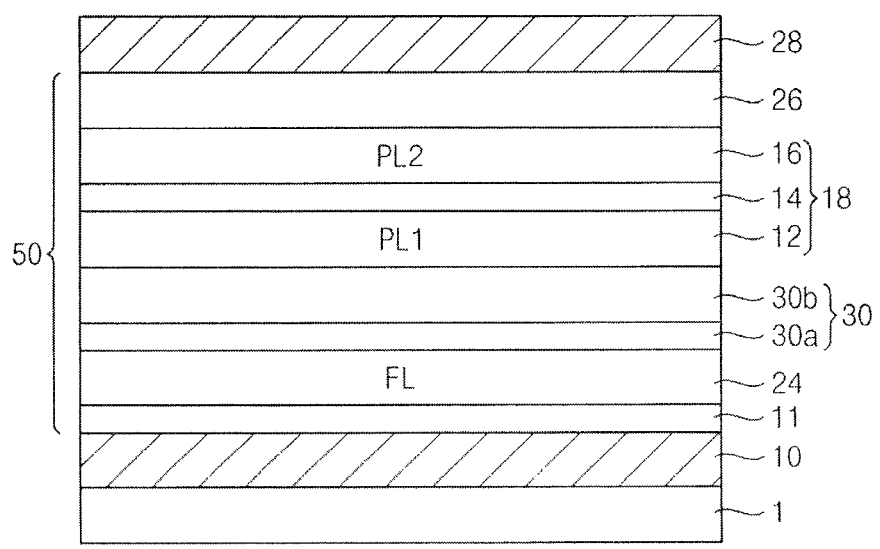
FIG. 2 illustrates a cross-sectional view of an MRAM device in accordance with other example embodiments.

FIG. 1 illustrates a cross-sectional view of an MRAM device in accordance with example embodiments, and FIG. 2 illustrates a cross-sectional view of an MRAM device in accordance with other example embodiments.

Referring to FIG. 1, the MRAM device may include a lower electrode layer 10, an MTJ structure layer 50, and an upper electrode layer 28 sequentially stacked on a substrate 1. The MTJ structure layer 50 may include a seed layer 11, a first pinned layer (PL1) 12, a first spacer layer 14, a second pinned layer (PL2) 16, a tunnel barrier structure 30, a free layer (FL) 24, and an upper oxide layer 26 sequentially stacked.

The substrate 1 may include a semiconductor material, e.g., silicon, germanium, silicon-germanium, or III-V semiconductor compounds, e.g., GaP, GaAs, GaSb, etc. In an implementation, the substrate 1 may be a silicon-on-insulator (SOI) substrate or a germanium-on-insulator (GOI) substrate.

In an implementation, various types of elements, e.g., word lines, transistors, diodes, source/drain layers, contacts plugs, vias, wirings, etc., and an insulating interlayer covering the elements may be formed on the substrate 1.

The lower electrode layer 10 and the upper electrode layer 28 may include a metal, e.g., tungsten, titanium, tantalum, etc., or a metal nitride, e.g., tungsten nitride, titanium nitride, tantalum nitride, etc.

The seed layer 11 may serve as a seed such that the first pinned layer (PL1) 12 of the MTJ structure layer 50 may grow in a desired crystalline orientation. The seed layer 11 may include a metal, e.g., ruthenium, rhenium, iridium, rhodium, hafnium, etc. In an implementation, the seed layer 11 may include ruthenium.

The first pinned layer (PL1) 12 and the second pinned layer (PL2) 16 may include a ferromagnetic material, e.g., cobalt, platinum, iron, nickel, etc. In an implementation, the first and second pinned layers (PL1 and PL2) 12 and 16 may include a cobalt platinum alloy (CoPt) or a multi-layered structure including a cobalt layer and a platinum layer alternately stacked.

The first spacer layer 14 may include, e.g., a synthetic anti-ferromagnetic (SAF) material. For example, the first spacer layer 14 may serve as an anti-ferromagnetic coupling spacer. The first spacer layer 14 may include, e.g., ruthenium, iridium, rhodium, etc.

In an implementation, the second pinned layer (PL2) 16 may include a cobalt-iron (CoFe) based material. In an implementation, the second pinned layer (PL2) 16 may include, e.g., CoFe, NiFe, FeCr, CoFeNi, PtCr, CoCrPt, CoFeB, NiFeSiB, CoFeSiB, etc.

A stacked structure including the seed layer 11, the first pinned layer (PL1) 12, the first spacer layer 14 and the second pinned layer (PL2) 16 may serve as a fixed layer structure 18. In an implementation, the fixed layer structure 18 may not include the first and second pinned layers (PL1 and PL2) 12 and 16, but may include only one pinned layer.

The free layer 24 may include a ferromagnetic material, e.g., cobalt, platinum, iron, nickel, etc. The free layer 24 may further include boron or silicon. These may be used alone or in a combination thereof. In an implementation, the free layer 24 may include, e.g., CoFe, NiFe, FeCr, CoFeNi, PtCr, CoCrPt, CoFeB, NiFeSiB, CoFeSiB, etc.

In an implementation, the MTJ structure layer 50 may have a suitable structure. FIG. 1 shows that the free layer 24 is disposed over the fixed layer structure 18. In an implementation, referring to FIG. 2, the free layer 24 may be disposed under the fixed layer structure 18. In this case, the MTJ structure layer 50 may include the seed layer 11, the free layer 24, the tunnel barrier structure 30, the first pinned layer (PL1) 12, the first spacer layer 14, the second pinned layer (PL2) 16, and the upper oxide layer 26 sequentially stacked.

The tunnel barrier structure 30 may include an insulating metal oxide. For example, the tunnel barrier structure 30 may include magnesium oxide or aluminum oxide.

The tunnel barrier structure 30 may include first and second tunnel barrier layers 30a and 30b that may be formed under different conditions. In an implementation, the tunnel barrier structure 30 may have a thin thickness, e.g., of about 5 Å to about 30 Å.

The tunnel barrier structure 30 may form an insulating tunnel barrier in which a quantum mechanical tunneling or spin polarization may occur between the free layer 24 and the second pinned layer (PL2) 16. For example, the characteristics of the tunnel barrier structure 30 may be important in the electrical characteristics of the MRAM device. In an implementation, the tunnel barrier structure 30 may have uniform characteristics, e.g., a uniform resistance.

In an implementation, the tunnel barrier structure 30 may be formed by a DC sputtering process. The tunnel barrier structure 30 may be formed by depositing a metal layer through the DC sputtering process and then performing an oxidation process of the metal layer.

In an implementation, the first and second tunnel barrier layers 30a and 30b may include, e.g., a magnesium oxide. The first tunnel barrier layer 30a may have a magnesium content that is higher than a magnesium content of the second tunnel barrier layer 30b. For example, the first tunnel barrier layer 30a may include a magnesium rich oxide, and the second tunnel barrier layer 30b may include magnesium oxide.

The upper oxide layer 26 may include an insulating metal oxide. In an implementation, the upper oxide layer 26 may include, e.g., tantalum oxide, zirconium oxide, titanium oxide, vanadium oxide, yttrium oxide, scandium oxide, molybdenum oxide, magnesium oxide, cobalt oxide, etc.

When the upper oxide layer 26 includes, e.g., magnesium oxide, the upper oxide layer 26 may have a magnesium content that is higher than the magnesium content of the second tunnel barrier layer 30b. For example, the upper oxide layer 26 may include a magnesium rich oxide.

FIGS. 3A, 3B, 3C, 3D, 4A, 4B, 4C, 4D, 5A and 5B illustrate cross-sectional views of stages in a method of manufacturing an MRAM device in accordance with example embodiments.

Figure 3A:
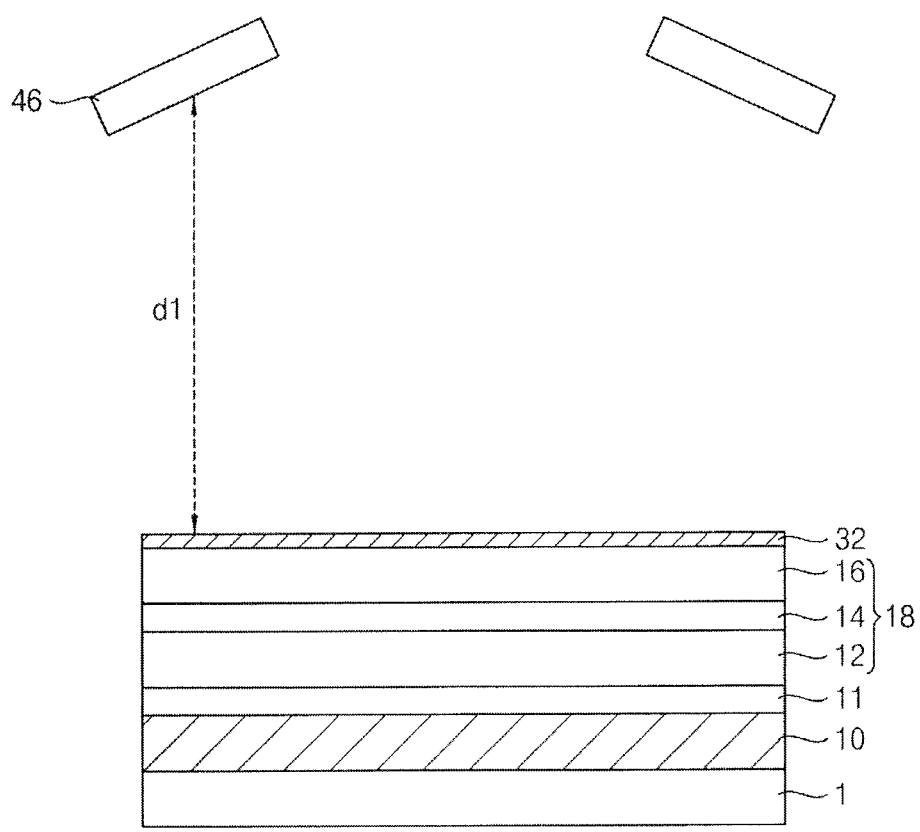
FIGS. 3A, 3B, 3C, 3D, 4A, 4B, 4C, 4D, 5A and 5B illustrate cross-sectional views of stages in a method of manufacturing an MRAM device in accordance with example embodiments.
Figure 3B:
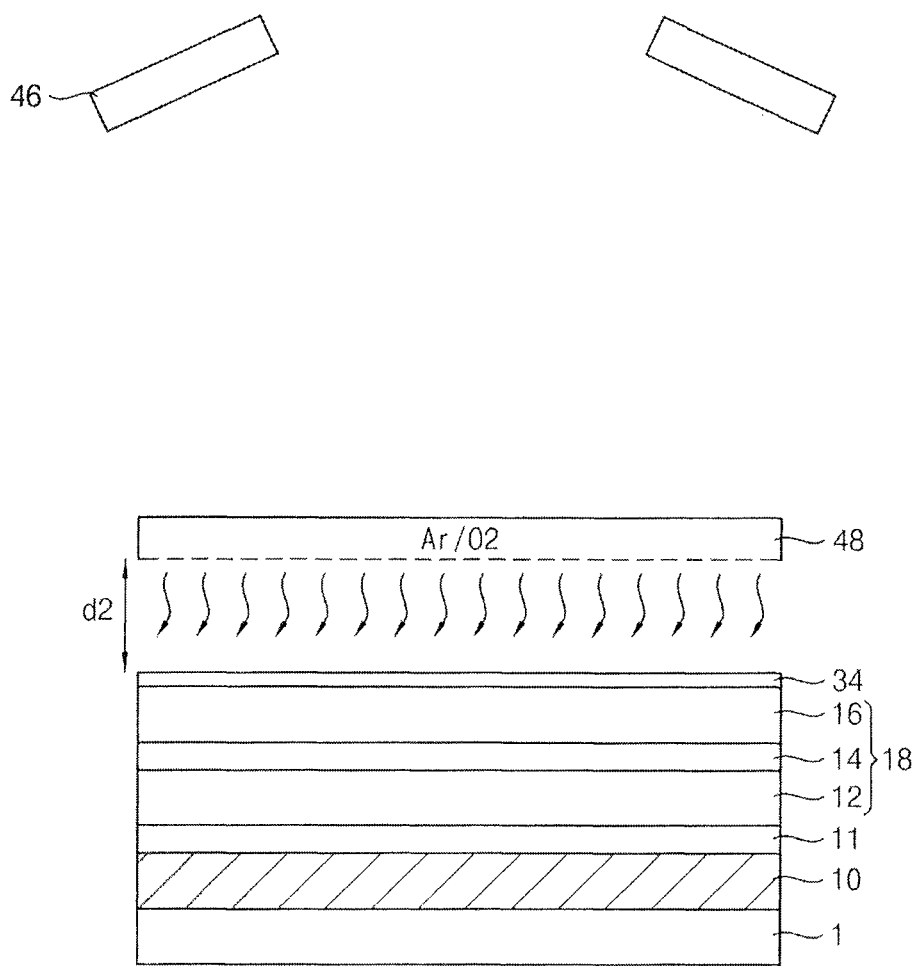
Figure 3C:
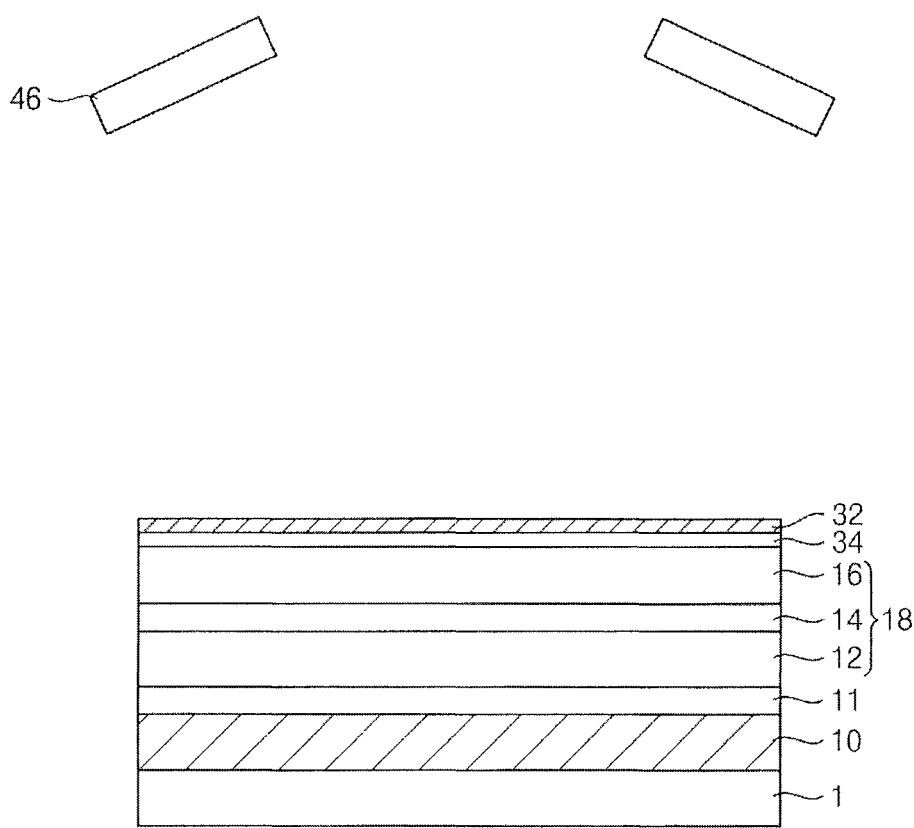
Figure 3D:
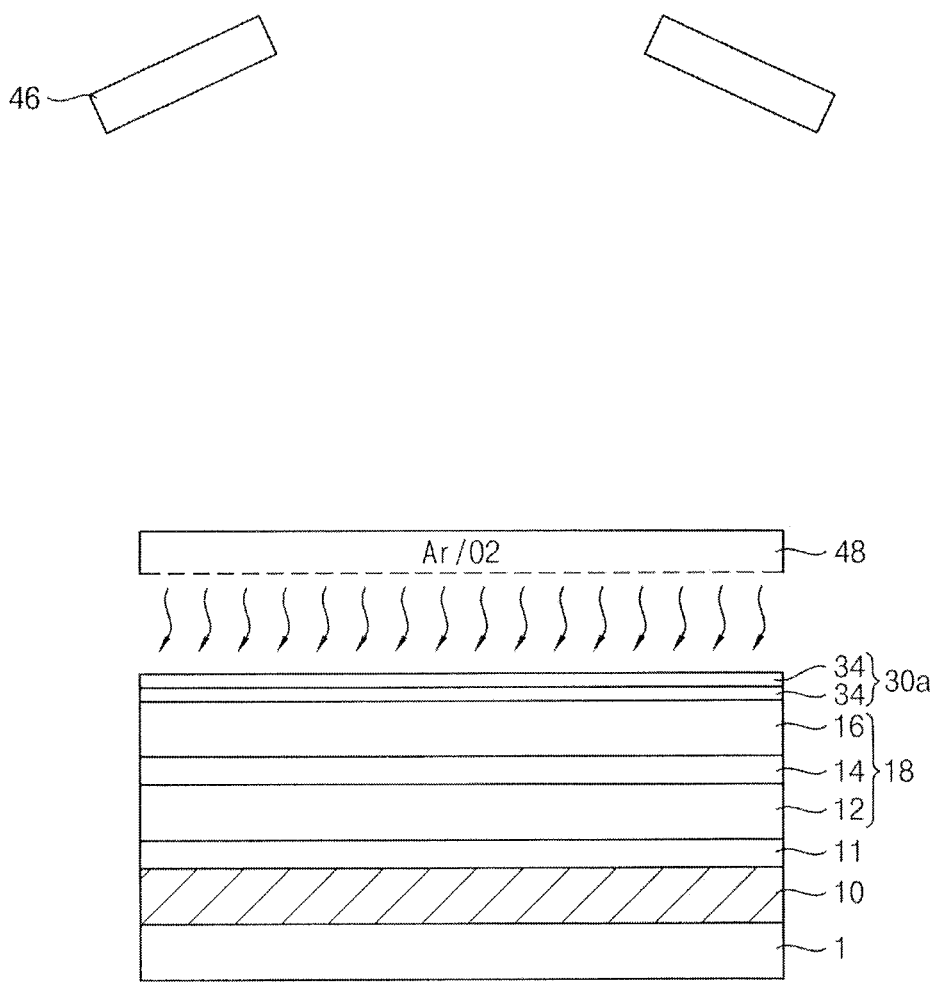
Figure 4A:
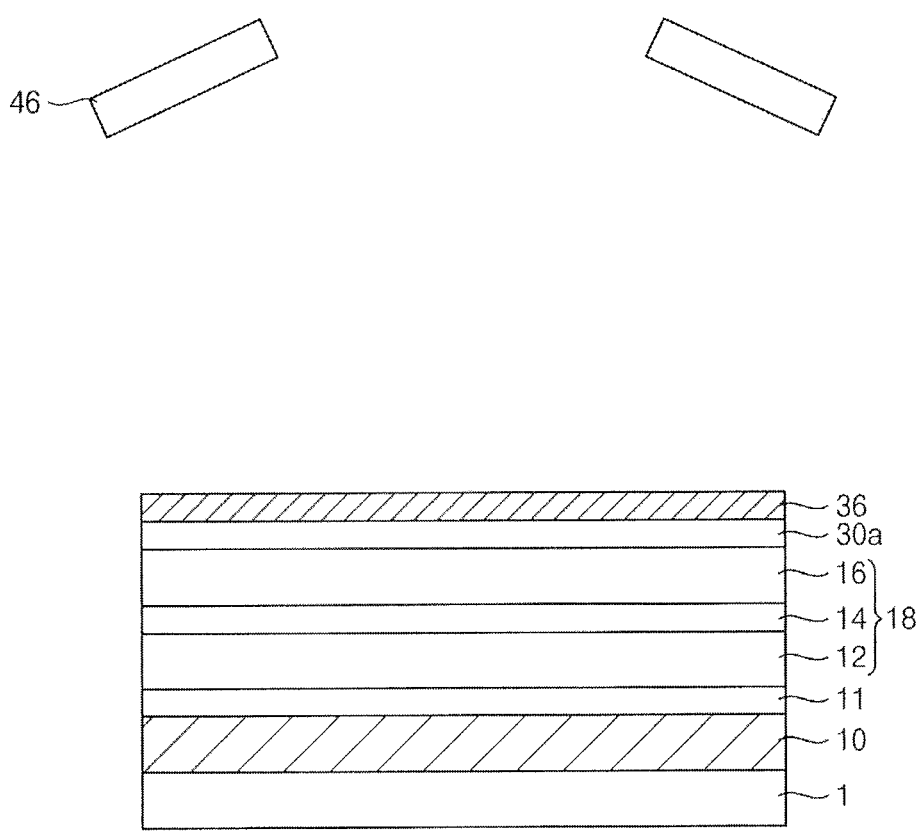
Figure 4B:
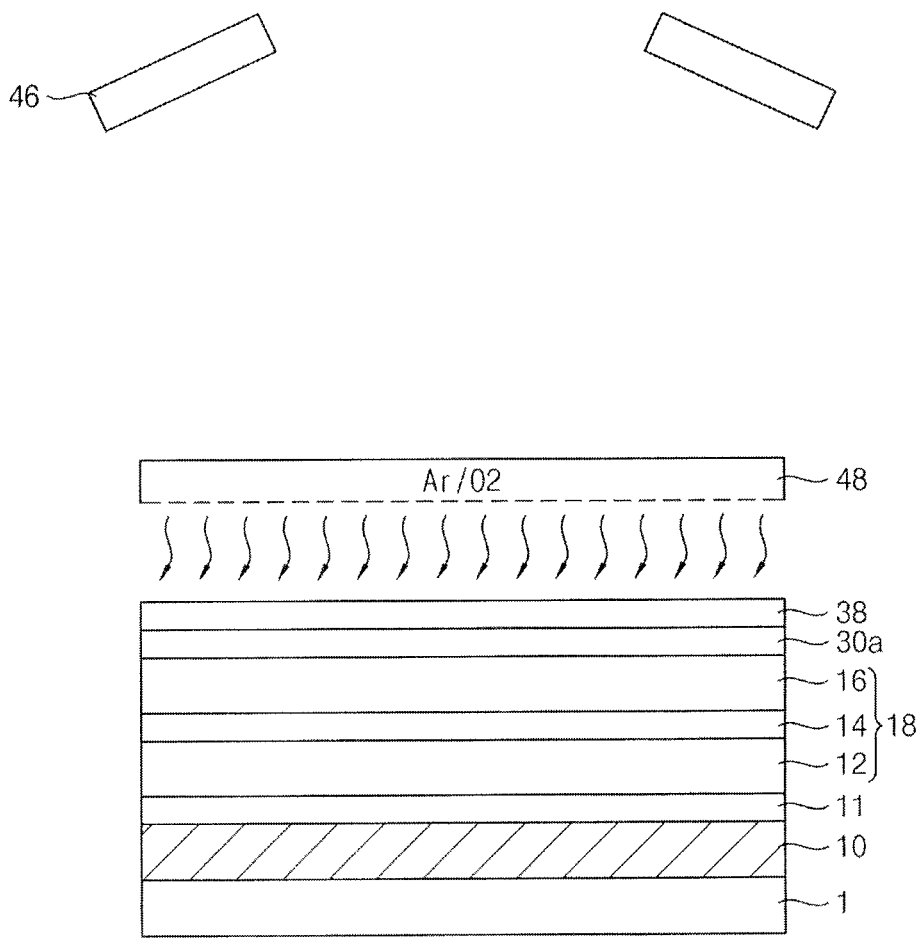
Figure 4C:
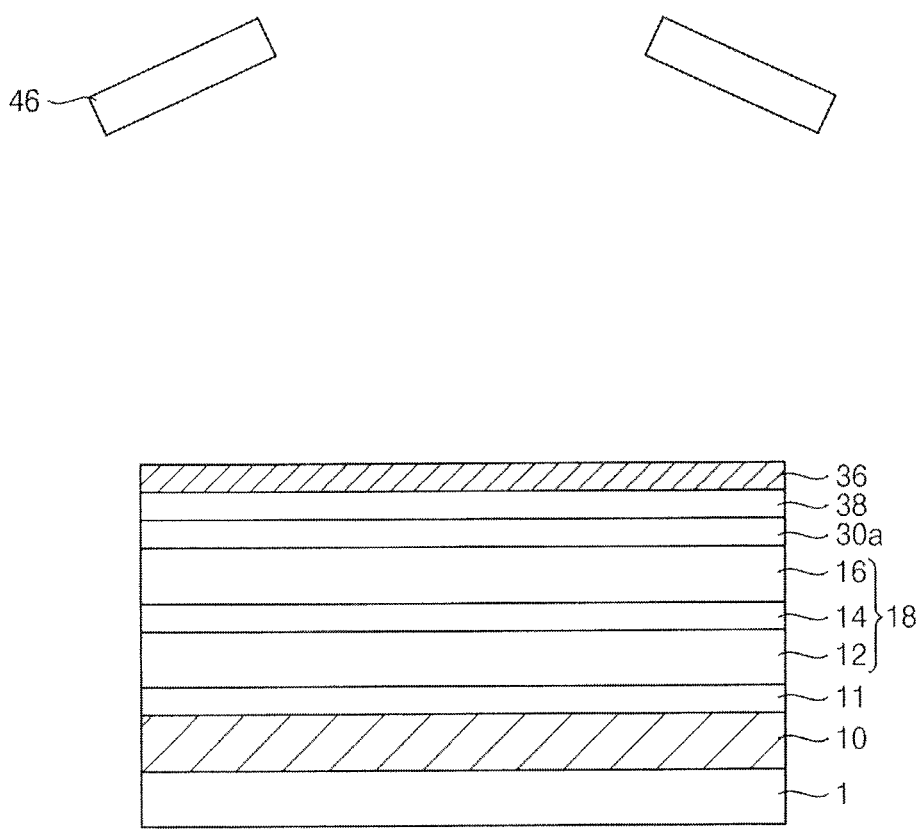
Figure 4D:
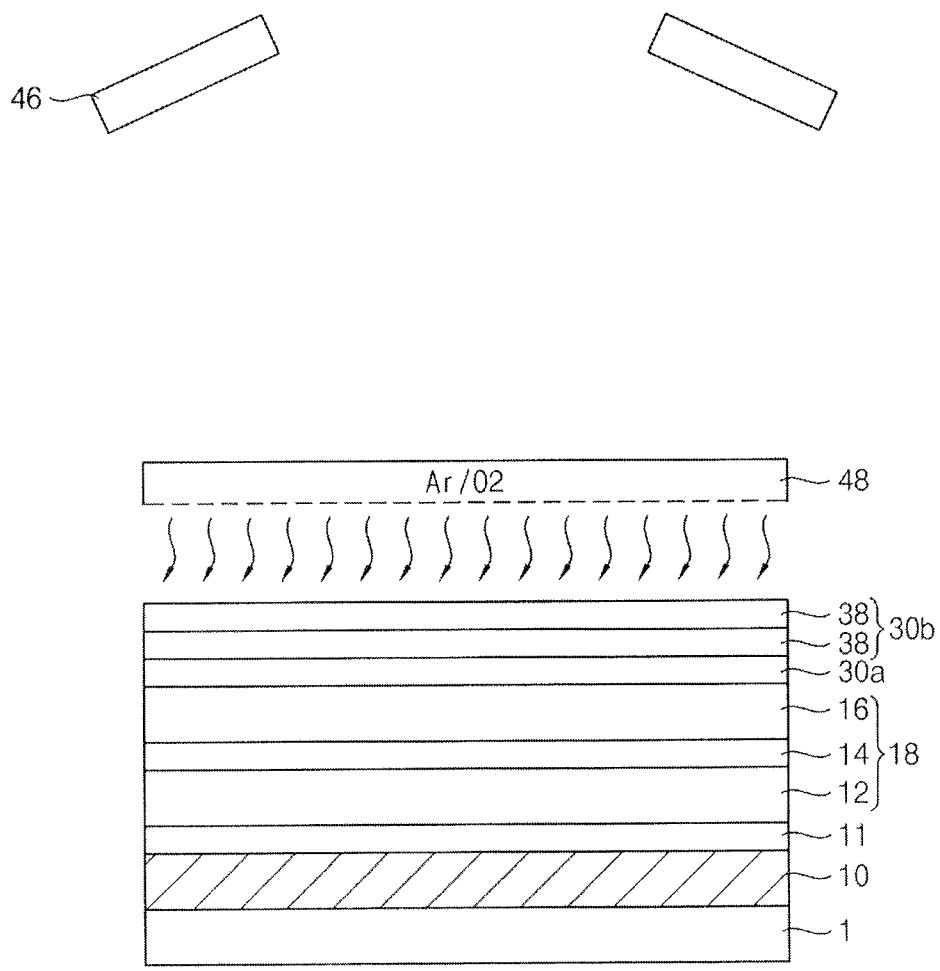
Figure 5A:
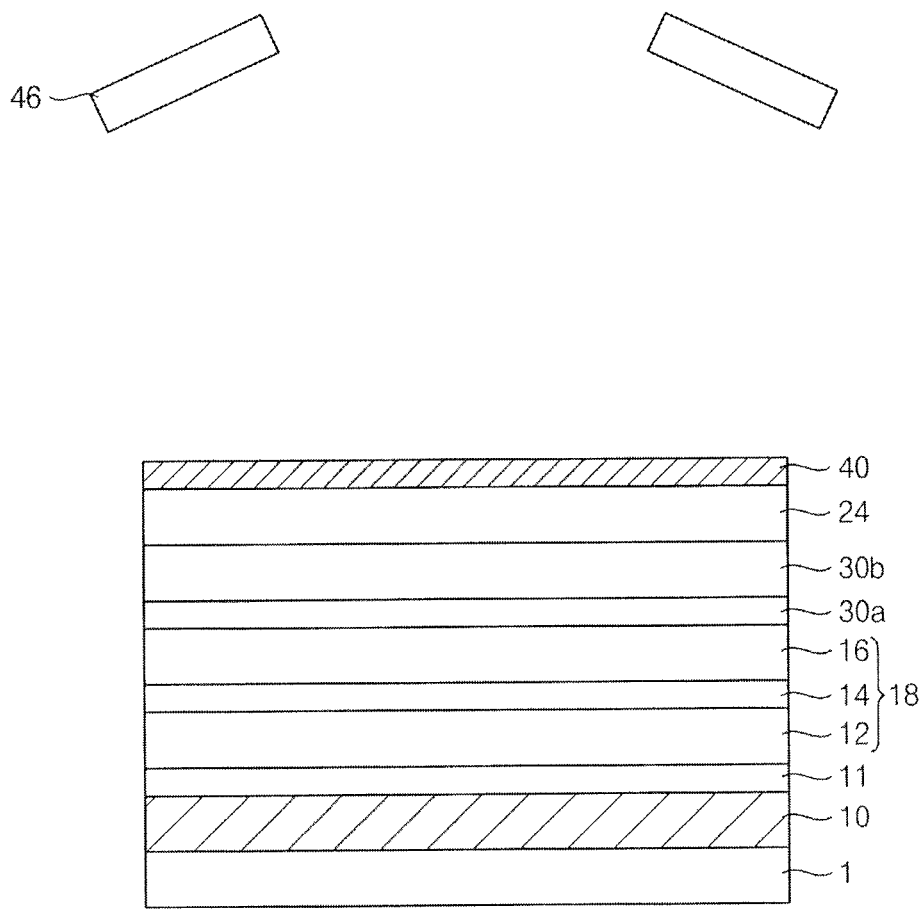
Figure 5B:
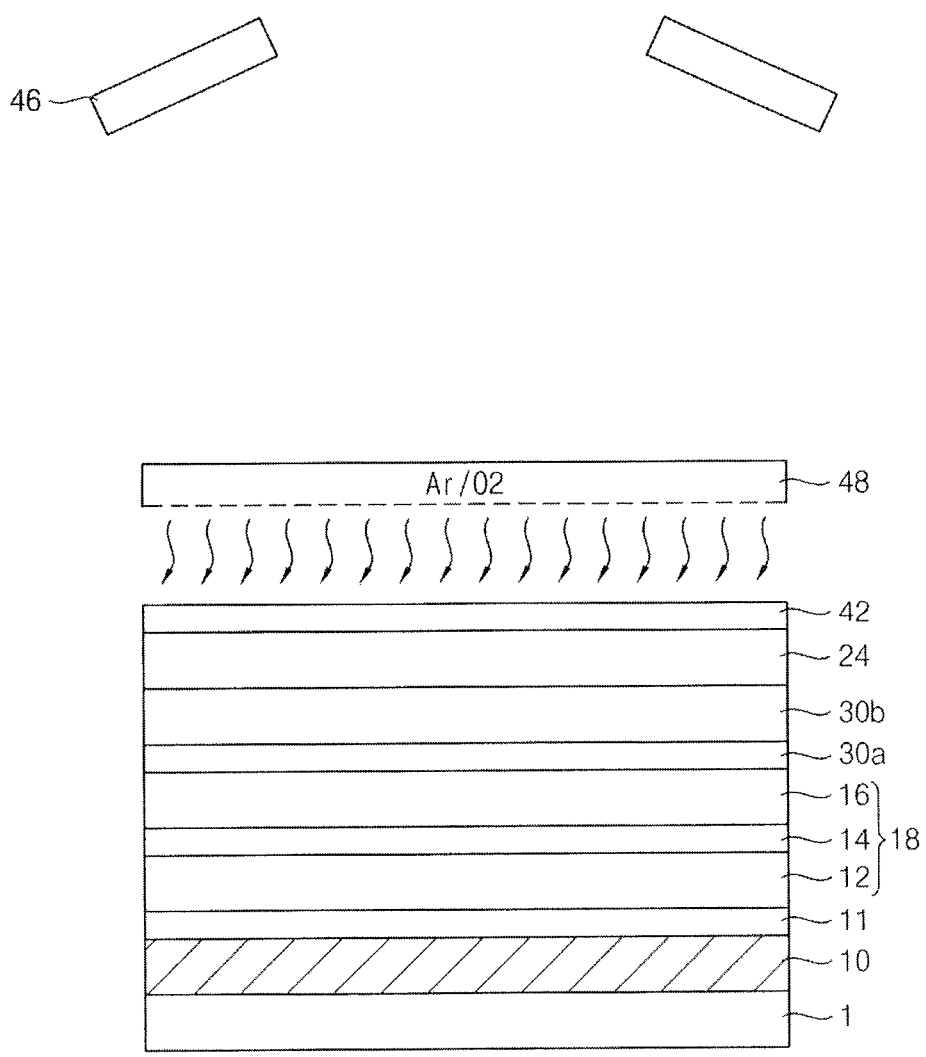

For example, FIGS. 3A, 3B, 3C and 3D illustrate cross-sectional views of stages in a method of forming a first tunnel barrier layer, FIGS. 4A, 4B, 4C and 4D illustrate cross-sectional views of stages in a method of forming a second tunnel barrier layer, and FIGS. 5A and 5B illustrate cross-sectional views of stages in a method of forming an upper insulation layer.

As shown in FIG. 1, a lower electrode layer 10, a seed layer 11, a first pinned layer (PL1) 12, a first spacer layer 14, and a second pinned layer (PL2) 16 may be sequentially formed on a substrate 1. In an implementation, as shown in FIG. 2, the lower electrode layer 10, the seed layer 11, and a free layer 24 may be sequentially formed on the substrate 1. Hereinafter, the MRAM device having the structure of FIG. 1 will be illustrated.

Referring to FIG. 3A, a DC sputtering may be performed to form a first magnesium layer 32 on the second pinned layer (PL2) 16.

For example, the substrate 1 having the second pinned layer (PL2) 16 thereon may be loaded onto a deposition chamber for the DC sputtering process. The deposition chamber may have a target 46 including magnesium.

In an implementation, the deposition chamber may include one or two targets 46. When the deposition chamber includes two targets 46, the targets 46 may be disposed such that a lower surface of the targets 46 may not be parallel, but rather slanted or inclined relative to an upper surface of the substrate 1. When the deposition chamber includes one target 46, the target 46 may be disposed such that the lower surface of the target 46 may be parallel to the upper surface of the substrate 1.

The target 46 may be spaced apart from the upper surface of the substrate 1 by a first distance d1. In an implementation, the first distance d1 may be in a range of about 100 mm to about 300 mm. Ionized atoms may collide with the target 46 to form a first magnesium layer 32. In an implementation, the first magnesium layer 32 may have a thickness of about 0.5 Å to about 10 Å.

Referring to FIG. 3B, a mixed gas (including, e.g., an inert gas and oxygen gas) may be provided onto the first magnesium layer 32 so that the first magnesium layer 32 may be oxidized to form a first magnesium oxide layer 34. The oxidation process may be performed in the deposition chamber.

Magnesium may be oxidized very fast so that not only the first magnesium layer 32 but also the underlying second pinned layer (PL2) 16 could be oxidized. Thus, process conditions may be controlled so that only the first magnesium layer 32 may be oxidized without oxidizing the second pinned layer (PL2) 16. For example, the reaction rate of the oxidation may be reduced.

For example, the inert gas may include argon, helium, neon, xenon, etc. In an implementation, the inert gas may include argon. The inert gas may be provided so that the reaction rate of the oxidation process may be reduced and the oxidation may be easily controlled.

An inflow rate of oxygen gas may be reduced so that the reaction rate of the oxidation may be reduced. If the inflow rate of oxygen gas were to be too small, the oxidation may not be uniformly performed on an entire surface of the first magnesium layer 32 so that the first magnesium oxide layer 34 may not have uniform characteristics. However, the mixed gas including an inert gas and oxygen gas may be provided into the deposition chamber so that the entire amount of gas provided into the deposition chamber may increase. Accordingly, the rate of oxidation may be exactly controlled by using the mixed gas.

An amount of inert gas may be greater than an amount of oxygen gas in the mixed gas. In an implementation, the mixed gas may include, e.g., about 80% to about 95% of inert gas. In an implementation, the mixed gas may be provided onto the first magnesium layer 32 at a flow rate of, e.g., about 10 sccm to about 30 sccm.

The inert gas and oxygen gas may be mixed with each other to be provided onto the first magnesium layer 32, and thus the first magnesium layer 32 may be uniformly oxidized. If an inert gas and oxygen gas were to be independently provided from different gas supplies, the first magnesium layer 32 may not be uniformly oxidized.

The deposition process of the first magnesium layer 32 and the oxidation process for the first magnesium layer 32 may be performed at a temperature of, e.g., about 10° C. to about 50° C. As the process temperature decreases, the oxidation reaction rate may decrease. In an implementation, when the deposition process and the oxidation process are performed at room or ambient temperature, the first magnesium oxide layer 34 may include magnesium rich oxide.

When the first magnesium oxide layer 34 is formed, the mixed gas may be provided onto the first magnesium layer 32 at a second distance d2 (that is smaller than the first distance d1). In an implementation, the second distance d2 may be about ⅓ to about ⅟30 of the first distance d1. For example, the second distance d2 may be in a range of about 10 mm to about 30 mm.

Maintaining the second distance d2 at about 30 mm or less helps ensure that the first magnesium layer 32 is oxidized at the above temperature when the mixed gas is provided, thereby ensuring that the first magnesium oxide layer 34 may be formed. Maintaining the second distance d2 at about 10 mm or greater may help ensure that the first magnesium layer 32 is not excessively oxidized by the mixed gas. Thus, the mixture gas may be provided onto the first magnesium layer 32 within the above range of distance.

A supply member or gas supplier 48 for providing the mixed gas for oxidizing the first magnesium layer 32 may be movable in the deposition chamber. For example, when the oxidation process is performed, the gas supplier 48 may be moved to face the substrate 1.

Referring to FIG. 3C, another first magnesium layer 32 may be formed on the first magnesium oxide layer 34.

The other first magnesium layer 32 may be formed by the same process illustrated with reference to FIG. 3A.

Referring to FIG. 3D, the other first magnesium layer 32 may be oxidized to form another first magnesium oxide layer 34.

The other first magnesium oxide layer 34 may be formed by the same process illustrated with reference to FIG. 3B.

For example, a deposition process of first magnesium layers 32 and the oxidation process for the first magnesium layers 32 may be repeatedly performed to form the first tunnel barrier layer 30a having a desired thickness (e.g., such that the first tunnel barrier layer 30a is formed from a multi-layer structure of separately formed first magnesium oxide layers 34). In an implementation, the multi-layer structure of separately formed first magnesium oxide layers 34 may have a monolithic structure such that the multi-layer structure is indistinguishable from a single, continuous layer. In an implementation, the first tunnel barrier layer 30a may have a thickness that is about 30% to about 70% of the tunnel barrier structure 30. In an implementation, the tunnel barrier structure 30 may have a thin thickness, e.g., of about 5 Å to about 30 Å.

As described above, the first tunnel barrier layer 30a may be formed such that an underlying magnetic material, e.g., the second pinned layer 16, may not be oxidized. The oxidation reaction may be uniformly performed on the first magnesium layer 32 so that the first tunnel barrier layer 30a may have uniform characteristics.

A second tunnel barrier layer 30b may be formed on the first tunnel barrier layer 30a. The second tunnel barrier layer 30b may be formed in the same deposition chamber as that of the first tunnel barrier layer 30a.

For example, referring to FIG. 4A, a second magnesium layer 36 may be formed on the first tunnel barrier layer 30a.

The second magnesium layer 36 may be formed at a second temperature that is greater than the first temperature (at which the first magnesium layer 32 may be formed). In an implementation, the second magnesium layer 36 may be formed at a temperature of, e.g., about 50° C. to about 250° C. The deposition process of the second magnesium layer 36 may be substantially the same as that of the first magnesium layer 32 illustrated with reference to FIG. 3A, except for the temperature. In an implementation, the second magnesium layer 36 may have a thickness of, e.g., about 0.5 Å to about 10 Å.

Referring to FIG. 4B, a mixed gas (including an inert gas and oxygen gas) may be provided onto the second magnesium layer 36 so that the second magnesium layer 36 may be oxidized to form a second magnesium oxide layer 38. The oxidation process may be performed in the deposition chamber. In an implementation, the mixed gas used to oxidize the second magnesium (e.g., metal) layer may be same mixed gas used to oxidize the first magnesium (e.g., metal) layer or may be a different mixed gas.

The oxidation process for the second magnesium layer 36 may be performed at the second temperature at which the second magnesium layer 36 may be oxidized. In an implementation, the oxidation process for the second magnesium layer 36 may be performed at a temperature of, e.g., about 50° C. to about 250° C.

The oxidation process for the second magnesium layer 36 may be substantially the same as that for the first magnesium layer 32 illustrated with reference to FIG. 3B, except for the temperature. Thus, the second magnesium layer 36 may have uniform characteristics.

The temperature of the second oxidation process may be greater than the first temperature, and thus the second magnesium layer 36 may be oxidized more actively than the first magnesium layer 32. Accordingly, the second magnesium oxide layer 38 may have a magnesium content that is less than that of the first magnesium oxide layer 34.

Referring to FIG. 4C, another second magnesium layer 36 may be formed on the second magnesium oxide layer 38.

The other second magnesium layer 36 may be formed by the same process illustrated with reference to FIG. 4A.

Referring to FIG. 4D, the other second magnesium layer 36 may be oxidized to form another second magnesium oxide layer 38.

The other second magnesium oxide layer 38 may be formed by the same process illustrated with reference to FIG. 4B.

For example, the deposition process of the second magnesium layer 36 and the oxidation process for the second magnesium layer 36 may be repeatedly performed to form the second tunnel barrier layer 30b having a desired thickness (e.g., such that the second tunnel barrier layer 30b is formed from a multi-layer structure of separately formed second magnesium oxide layers 38). In an implementation, the multi-layer structure of separately formed second magnesium oxide layers 38 may have a monolithic structure such that the multi-layer structure is indistinguishable from a single, continuous layer. In an implementation, the second tunnel barrier layer 30b may have a thickness that is about 30% to about 70% of the tunnel barrier structure 30.

As described above, the second tunnel barrier layer 30b may include the sufficiently oxidized second magnesium oxide layers 38.

The tunnel barrier structure 30 may be formed to include magnesium oxide on the second pinned layer 16 by the above processes. The tunnel barrier structure 30 may have uniform characteristics.

As described above, in an implementation, the tunnel barrier structure 30 may include, e.g., magnesium oxide. In an implementation, the tunnel barrier structure 30 may include other metal oxides.

Referring to FIGS. 5A and 5B, a free layer 24 may be formed on the tunnel barrier structure (see, e.g., 30 in FIG. 1). An upper oxide layer 26 may be formed on the free layer 24. In an implementation, the upper oxide layer 26 may include, e.g., titanium oxide, tantalum oxide, zirconium oxide, cobalt oxide, magnesium oxide, etc.

The upper oxide layer 26 may be formed by processes substantially the same as or similar to those of the first tunnel barrier layer 30a, except for the temperatures at which the deposition process and the oxidation process are performed.

As shown in FIG. 5A, a metal layer 40 may be formed on the free layer 24. In an implementation, the metal layer 40 may include. e.g., tantalum, zirconium, titanium, vanadium, yttrium, scandium, molybdenum, magnesium, cobalt, etc. The metal layer 40 may be formed by a DC sputtering process. In an implementation, the metal layer 40 may have a thickness of, e.g., about 0.5 Å to about 10 Å.

As shown in FIG. 5B, a mixed gas (including an inert gas and oxygen gas) may be provided onto the metal layer 40 to form a metal oxide layer 42.

The deposition process of the metal layer 40 and the oxidation process for the metal layer 40 may be substantially the same as those illustrated with reference to FIGS. 3A and 3B. However, the target 46 may include other metals according to the sort of the metal layer 40. Additionally, the deposition process and the oxidation process may be performed at a third temperature that is lower than the second temperature. In an implementation, the deposition process and the oxidation process may be performed at a temperature of, e.g., about 10° C. to about 50° C. In an implementation, the deposition process and the oxidation process may be performed at a temperature of about 50 K to about 200 K (i.e., at a temperature of about −73.15° C. to about −223.15° C.). In an implementation, the third temperature may be equal to or less than the first temperature.

When the deposition process and the oxidation process are performed at ambient temperature or an extremely low temperature, the oxidation reaction rate may decrease. Thus, the free layer 24 under the metal layer 40 may not be oxidized, but the metal layer 40 may be oxidized.

Another metal layer 40 may be formed on the metal oxide layer 42. The other metal layer 40 may be oxidized to form or become a part of the metal oxide layer 42.

The deposition process of the metal layer 40 and the oxidation process for the metal layer 40 may be repeatedly performed to form the upper oxide layer 26 (refer to FIG. 1) having a desired thickness. The upper oxide layer 26 may help protect underlying magnetic layers.

As shown in FIG. 1, an upper electrode layer 28 may be formed on the upper oxide layer 26, and thus the MRAM device may be manufactured.

FIGS. 6 to 14 illustrate cross-sectional views of stages in a method of manufacturing an MRAM device in accordance with example embodiments.

Figure 6:
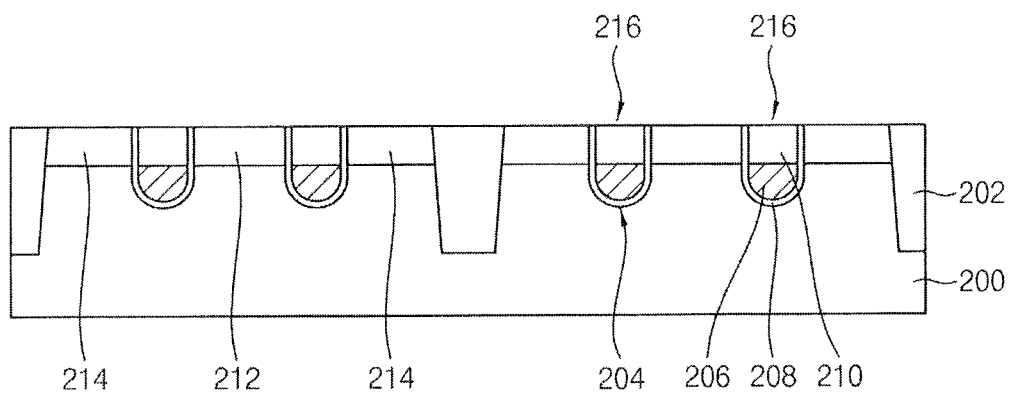
FIGS. 6 to 14 illustrate cross-sectional views of stages in a method of manufacturing an MRAM device in accordance with example embodiments.

Referring to FIG. 6, an isolation layer 202 may be formed on a substrate 200 so that the substrate 200 may be divided into an active region and a field region. The isolation layer may be formed by a shallow trench isolation (STI) process. In an implementation, a plurality of active regions having an island shape may be formed.

Transistors 216 may be formed on the substrate 200.

In an implementation, an etching mask may be formed on the substrate 200, the substrate 200 may be etched using the etching mask to form a trench 204 extending in a first direction. In an implementation, two trenches 204 may be formed on one active region. A gate structure including a gate insulation pattern 208, a gate electrode 206, and a hard mask 210 sequentially stacked may be formed in the trench 204. Impurities may be implanted into an upper portion of the active region of the substrate 200 adjacent the gate structure to form a source region 212 and a drain region 214. The source region 212 may serve as a common source for two neighboring transistors 216.

Figure 7:
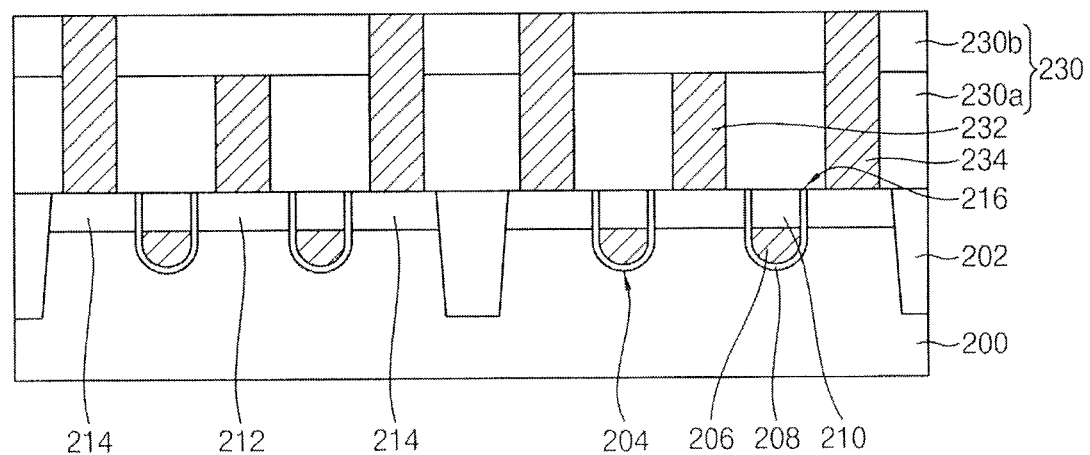

Referring to FIG. 7, a first lower insulating interlayer 230a may be formed on the substrate 200. A portion of the first lower insulating interlayer 230a may be etched to form first holes exposing upper surfaces of the source regions 212, respectively. A first conductive layer may be formed in the first holes and planarized to form source lines 232 contacting the source regions 212, respectively.

A second lower insulating interlayer 230b may be formed on the first lower insulating interlayer 230a and the source lines 232. Thus, a lower insulating interlayer structure 230 including the first and second lower insulating interlayers 230a and 230b may be formed.

Second holes may be formed through the lower insulating interlayer structure 230 to expose the drain regions 214, respectively. A second conductive layer may be formed in the second holes and planarized to form contact plugs 234 contacting the drain regions 214, respectively.

Figure 8:
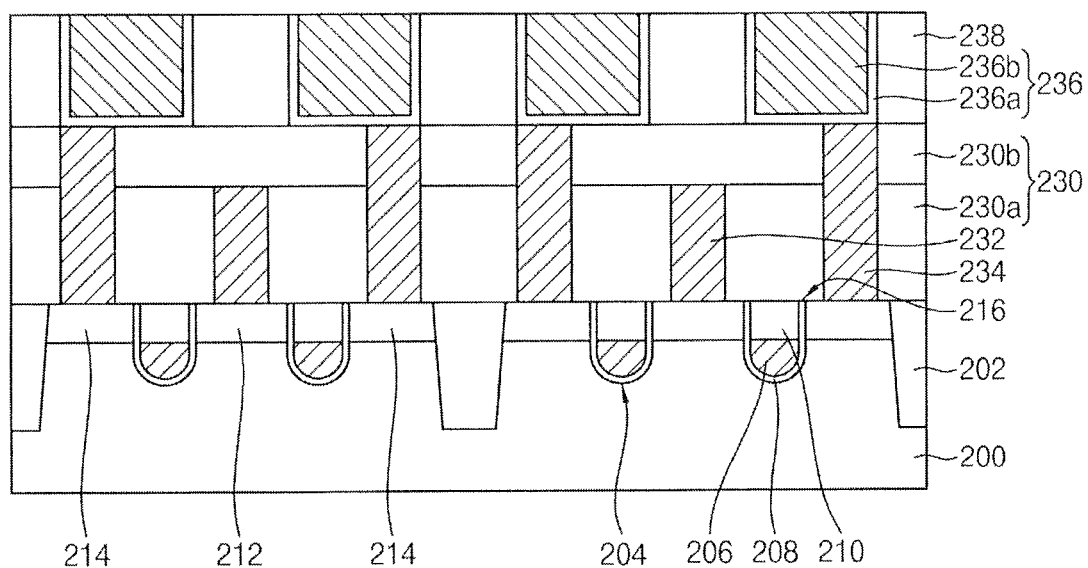

Referring to FIG. 8, a first insulating interlayer 238 may be formed on the lower insulating interlayer structure 230, and a first wiring structure 236 may be formed through the first insulating interlayer 238 to contact the contact plug 234. The first wiring structure 236 may include a first barrier pattern 236a and a first conductive pattern 236b.

In an implementation, the first conductive pattern 236b of the first wiring structure 108 may include, e.g., copper. In an implementation, the first conductive pattern 236b of the first wiring structure 236 may include, e.g., tungsten, aluminum, etc.

Figure 9:
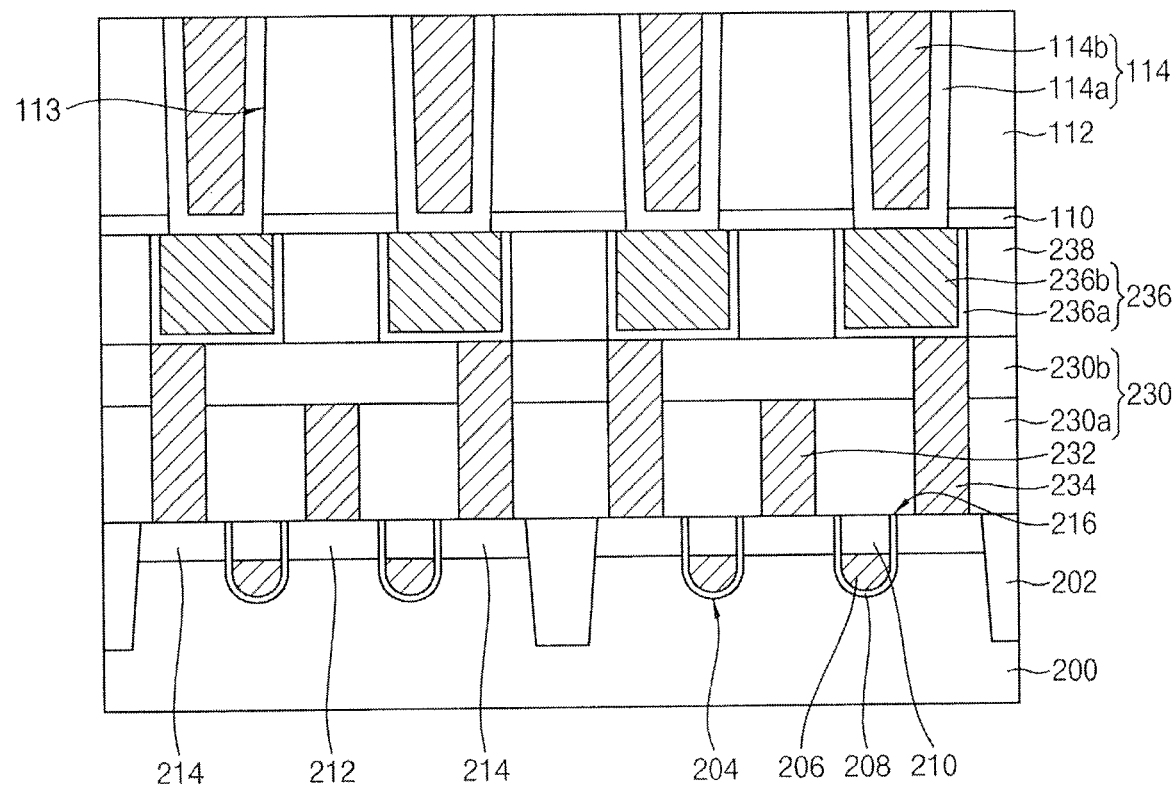

Referring to FIG. 9, an etch stop layer 110, a second insulating interlayer 112, and a lower electrode contact plug 114 may be formed on the first insulating interlayer 238 and the first wiring structure 236.

The etch stop layer 110 may be formed by, e.g., chemical vapor deposition (CVD) process, or an atomic layer deposition (ALD) process, and may include. e.g., silicon nitride. The second insulating interlayer 112 may be formed by, e.g., a CVD process, an ALD process, or a spin coating process.

The second insulating interlayer 112 and the etch stop layer 110 may be partially etched to form a first opening 113 exposing an upper surface of the first wiring structure 108.

A second barrier layer and a second conductive layer may be formed in the first opening 113. The second conductive layer and the second barrier layer may be planarized until an upper surface of the second insulating interlayer 112 may be exposed to form a second conductive pattern 114*b* and a second barrier pattern 114*a*, respectively. The second conductive pattern 114*b* and the second barrier pattern 114*a* may form the lower electrode contact plug 114.

Figure 10:
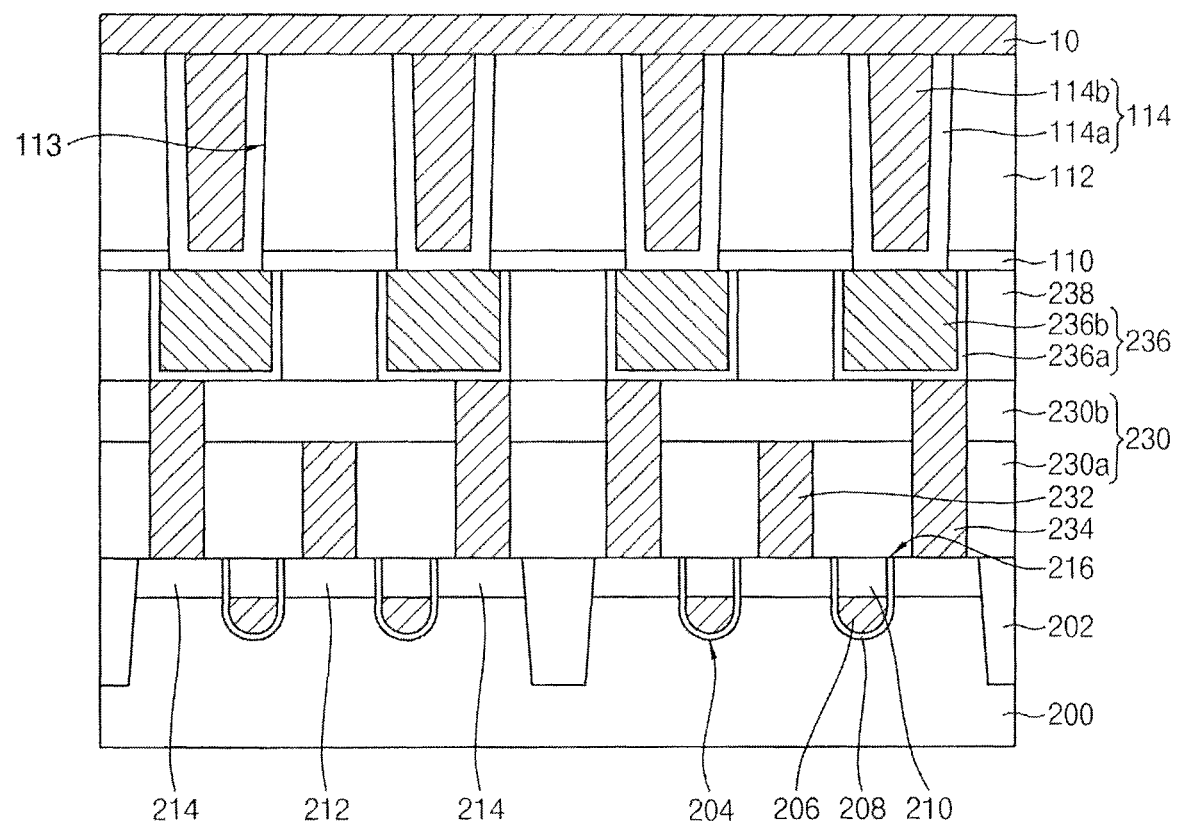

Referring to FIG. 10, a lower electrode layer 10 may be formed on the second insulating interlayer 112 and the lower electrode contact plug 114. The lower electrode layer 10 may include a metal or a metal nitride.

The lower electrode layer 10 may include a metal, e.g., tungsten, titanium, tantalum, etc., or a metal nitride, e.g., tungsten nitride, titanium nitride, tantalum nitride, etc.

Figure 11:
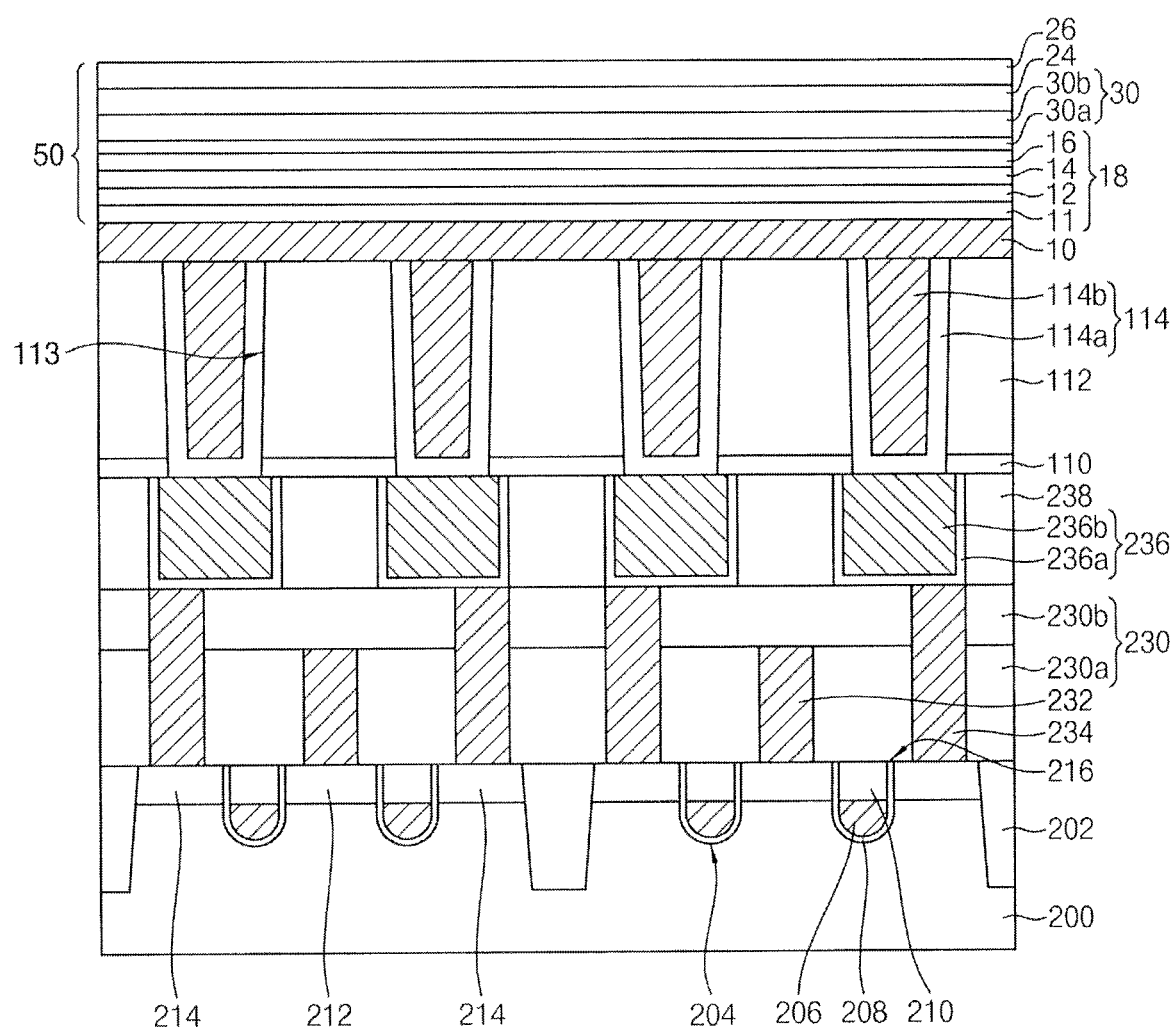

Referring to FIG. 11, an MTJ structure layer 50 may be formed on the lower electrode layer 10. The MTJ structure layer 50 may have substantially the same structure as that of FIG. 1 or 2.

In an implementation, the seed layer 11, the first pinned layer 12, the first spacer layer 14, and the second pinned layer 16 may be sequentially formed on the lower electrode layer 10. The tunnel barrier structure 30 may be formed on the second pinned layer 16. The free layer 24 and the upper oxide layer 26 may be formed on the tunnel barrier structure 30.

The tunnel barrier structure 30 may include the first and second tunnel barrier layers 30*a* and 30*b* that may be formed under different process conditions.

In an implementation, the tunnel barrier structure 30 may be formed by processes substantially the same as or similar to those illustrated with reference to FIGS. 3A to 3D and FIGS. 4A to 4D. Thus, the tunnel barrier structure 30 may be formed without oxidizing the underlying magnetic layer, e.g., the second pinned layer 16. The tunnel barrier structure 30 may have uniform characteristics regardless of positions on the substrate 200. Thus, the MRAM device may have uniform electrical characteristics regardless of positions thereof.

The upper oxide layer 26 may be formed by processes substantially the same as or similar to those illustrated with reference to FIGS. 5A and 5B. Thus, the upper oxide layer 26 may be formed without oxidizing the underlying magnetic layer, e.g., the free layer 24.

Figure 12:
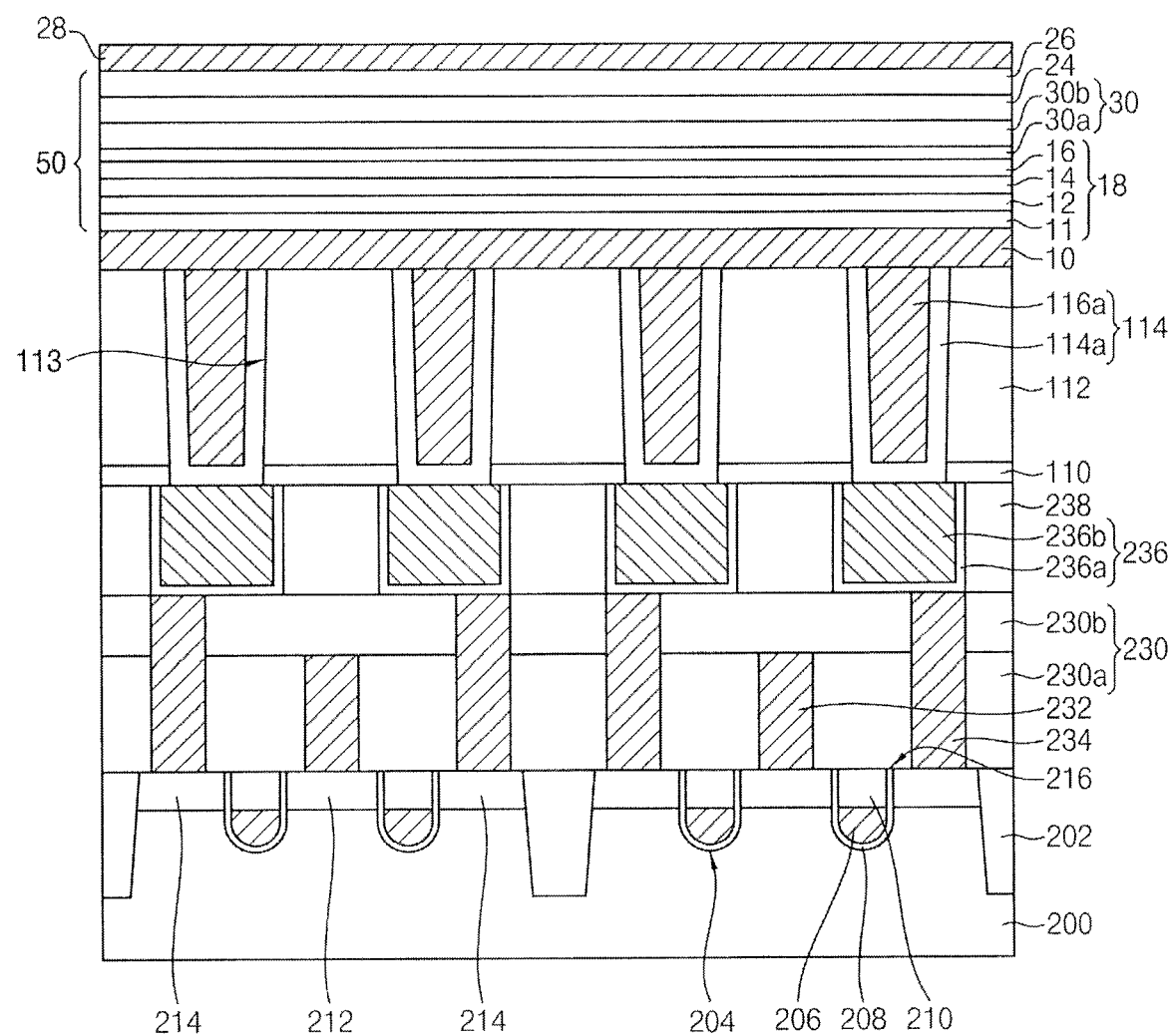

Referring to FIG. 12, an upper electrode layer 28 may be formed on the MTJ structure layer 50. The upper electrode layer 28 may include a metal or a metal nitride.

The upper electrode layer 28 may include a metal, e.g., tungsten, titanium, tantalum, etc., or a metal nitride, e.g., tungsten nitride, titanium nitride, tantalum nitride, etc.

Figure 13:
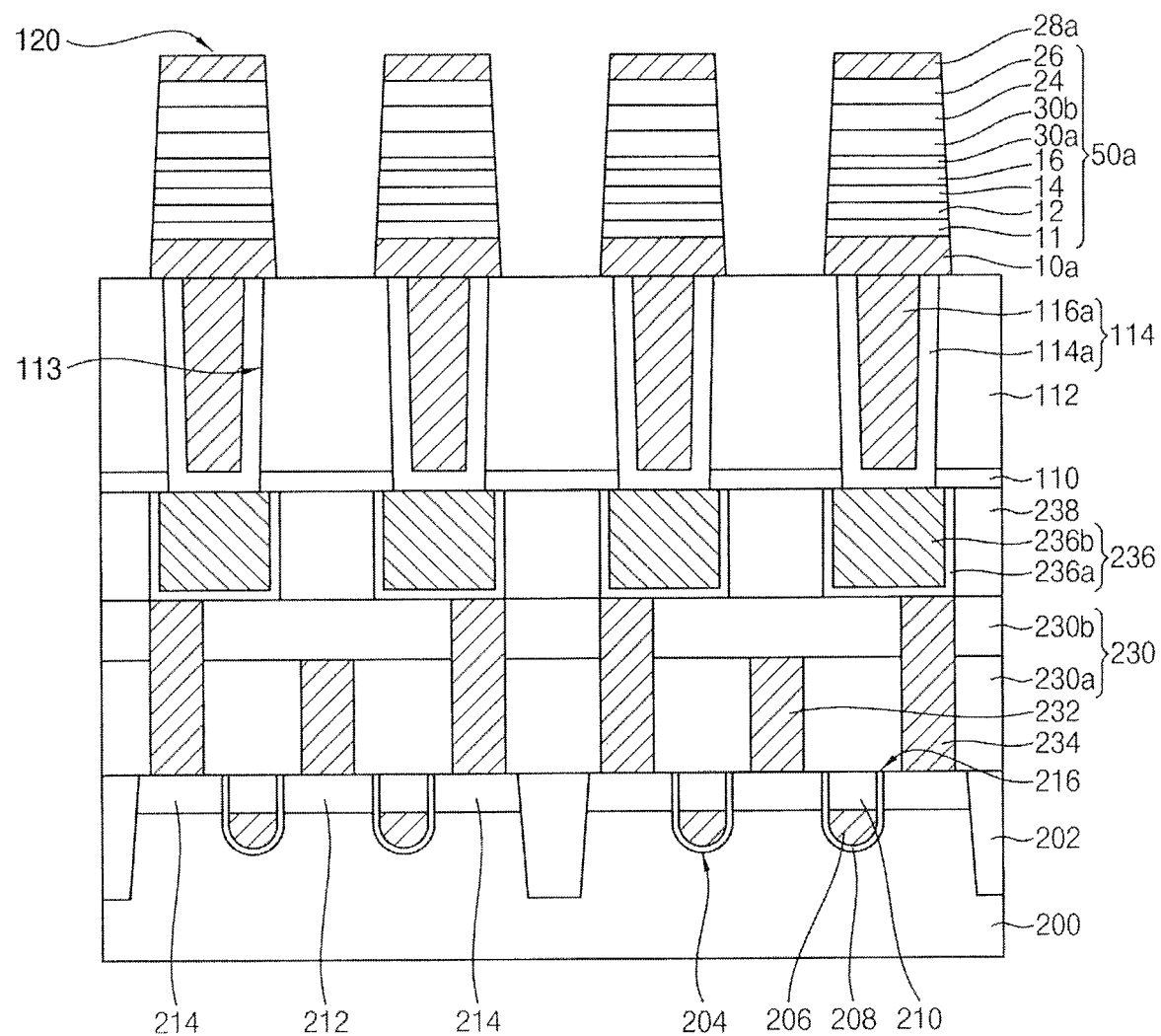

Referring to FIG. 13, the upper electrode layer 28 may be patterned to form an upper electrode 28*a*. The upper electrode 28*a* may overlap an upper surface of the lower electrode contact plug 114.

The MTJ structure layer 50 and the lower electrode layer 10 may be etched using the upper electrode 28*a* as an etching mask. The etching process may include a physical etching process. Accordingly, a variable resistance structure 120 including a lower electrode 10*a*, an MTJ structure 50*a* and the upper electrode 28*a* sequentially stacked may be formed.

Figure 14:
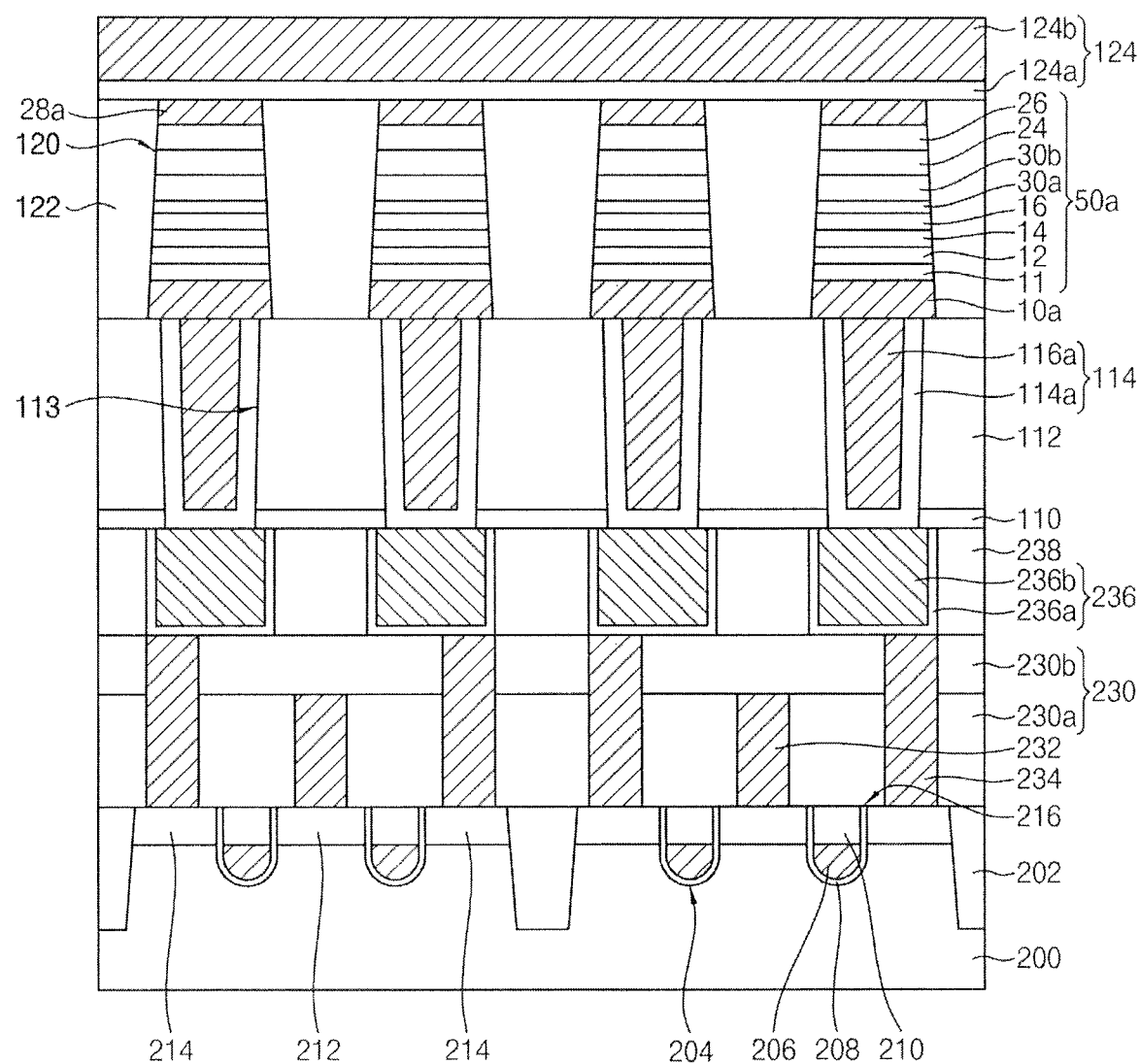

Referring to FIG. 14, a third insulating interlayer 122 may be formed on the second insulating interlayer 112 to cover the variable resistance structure 120.

A bit line 124 may be formed through the third insulating interlayer 122 to contact an upper surface of the variable resistance structure 120. The bit line 124 may extend in a second direction substantially perpendicular to the first direction to contact upper surfaces of a plurality of upper electrodes 28*a*. In an implementation, a plurality of bit lines 124 may be formed to be parallel to each other.

The bit line 124 may have a structure including a third barrier pattern 124*a* and a third conductive pattern 124*b*. The third barrier pattern 124*a* may include, e.g., titanium, titanium nitride, tantalum, tantalum nitride, etc. The third conductive pattern 124*b* may include, e.g., copper, tungsten, aluminum, etc.

In an implementation, an upper insulating interlayer may be further formed on the third insulating interlayer 122 and the bit line 124.

By the above processes, the MRAM device including the transistor, the lower electrode contact plug 114, and the variable resistance structure 120 may be formed. As illustrated above, the tunnel barrier structure 30 of the MRAM device may have a uniform resistance distribution. Additionally, the underlying magnetic layers may not be oxidized when the tunnel barrier structure 30 is formed and when the upper oxide layer 26 is formed. Accordingly, the MRAM device may have uniform electrical characteristics.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

The MRAM device may serve as a memory device for mobile equipment, memory cards, computers, etc.

By way of summation and review, it may be desirable for a tunnel barrier layer to have uniform characteristics.

The embodiments may provide a method of manufacturing an MRAM device having good characteristics.

The tunnel barrier structure in the MRAM device in accordance with example embodiments may have uniform characteristics. Thus, the MRAM device may have improved electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A method of manufacturing an MRAM device, the method comprising:
   forming a first magnetic layer on a substrate;
   forming a first tunnel barrier layer on the first magnetic layer such that the first tunnel barrier layer includes a first metal oxide, the first metal oxide being formed by oxidizing a first metal layer at a first temperature;
   forming a second tunnel barrier layer on the first tunnel barrier layer such that the second tunnel barrier layer includes a second metal oxide, the second metal oxide being formed by oxidizing a second metal layer at a second temperature that is greater than the first temperature; and
   forming a second magnetic layer on the second tunnel barrier layer,
   wherein:
   oxidizing the first metal layer includes providing a mixed gas on the first metal layer, the mixed gas including an inert gas and oxygen gas, and
   oxidizing the second metal layer includes providing the mixed gas on the second metal layer.

2. The method as claimed in claim 1, wherein the mixed gas includes 80% to 95% of the inert gas.

3. The method as claimed in claim 1, wherein the mixed gas is provided from a supplier located at a distance of 10 mm to 30 mm from a surface of the first metal layer or the second metal layer.

4. The method as claimed in claim 1, wherein:
   the first temperature is in a range of 10° C. to 50° C., and
   the second temperature is in a range of 50° C. to 250° C.

5. The method as claimed in claim 1, wherein forming the first tunnel barrier layer includes repeatedly forming the first metal layer and oxidizing the first metal layer.

6. The method as claimed in claim 1, wherein forming the second tunnel barrier layer includes repeatedly forming the second metal layer and oxidizing the second metal layer.

7. The method as claimed in claim 1, further comprising forming an upper oxide layer on the second magnetic layer such that the upper oxide layer includes a third metal oxide, the third metal oxide being formed by oxidizing a third metal layer at a third temperature that is lower than the second temperature.

8. The method as claimed in claim 7, wherein the third temperature is equal to or lower than the first temperature.

9. The method as claimed in claim 7, wherein oxidizing the third metal layer includes providing a mixed gas onto the third metal layer, the mixed gas including an inert gas and oxygen gas.

10. A method of manufacturing an MRAM device, the method comprising:
    forming a first magnetic layer on a substrate;
    forming a first metal layer on the first magnetic layer by performing a DC sputtering process;
    forming a first tunnel barrier layer that includes a first metal oxide by oxidizing the first metal layer at a first temperature with a mixed gas that includes an inert gas and oxygen gas;
    forming a second metal layer on the first tunnel barrier layer by performing a DC sputtering process;
    forming a second tunnel barrier layer that includes a second metal oxide by oxidizing the second metal layer with the mixed gas at a second temperature, that is greater than the first temperature; and
    forming a second magnetic layer on the second tunnel barrier layer.

11. The method as claimed in claim 10, wherein the mixed gas includes 80% to 95% of the inert gas.

12. The method as claimed in claim 10, wherein the mixed gas is provided from a supplier located at a distance of 10 mm to 30 mm from a surface of the first metal layer or the second metal layer.

13. The method as claimed in claim 10, wherein:
    the first temperature is in a range of 10° C. to 50° C., and
    the second temperature is in a range of 50° C. to 250° C.

14. The method as claimed in claim 10, further comprising:
    forming a third metal layer on the second magnetic layer by performing a DC sputtering process; and
    forming an upper oxide layer that includes a third metal oxide, the third metal oxide being formed by oxidizing the third metal layer at a third temperature that is lower than the first temperature.

15. A method of manufacturing an MRAM device, the method comprising:
    forming a first magnetic layer on a substrate;
    forming a first tunnel barrier layer on the first magnetic layer such that the first tunnel barrier layer includes a first metal oxide, the first metal oxide being formed by oxidizing a first metal layer;
    forming a second tunnel barrier layer on the first tunnel barrier layer such that the second tunnel barrier layer includes a second metal oxide, the second metal oxide being formed by oxidizing a second metal layer that includes a same metal as that of the first metal layer, such that the second tunnel barrier layer has a metal content that is less than a metal content of the first tunnel barrier layer; and
    forming a second magnetic layer on the second tunnel barrier layer, and
    forming an upper oxide layer on the second magnetic layer such that the upper oxide layer includes a third metal oxide, the third metal oxide being formed by oxidizing a third metal layer.

16. The method as claimed in claim 15, wherein:
    oxidizing the first metal layer includes providing a mixed gas on the first metal layer, the mixed gas including an inert gas and oxygen gas, and
    oxidizing the second metal layer includes providing the mixed gas on the second metal layer.

17. The method as claimed in claim 16, wherein the mixed gas is provided from a supplier located at a distance of 10 mm to 30 mm from a surface of the first metal layer or the second metal layer.

18. The method as claimed in claim 15, wherein:
    forming the first tunnel barrier layer is performed at a first temperature, and
    forming the second tunnel barrier layer is performed at a second temperature that is greater than the first temperature.

* * * * *